United States Patent [19]

Pfiester

[11] Patent Number: 5,024,959
[45] Date of Patent: Jun. 18, 1991

[54] CMOS PROCESS USING DOPED GLASS LAYER

[75] Inventor: James R. Pfiester, Austin, Tex.

[73] Assignee: Motorola, Inc., Schaumburg, Ill.

[21] Appl. No.: 412,059

[22] Filed: Sep. 25, 1989

[51] Int. Cl.⁵ .................. H01L 21/225; H01L 21/336
[52] U.S. Cl. ........................................ 437/34; 437/41; 437/44; 437/29; 437/30; 437/27; 437/28; 437/57; 437/164
[58] Field of Search ............... 437/27, 28, 29, 30, 437/34, 56, 57, 44, 162, 41, 40, 164; 357/23.3; 156/643

[56] References Cited

U.S. PATENT DOCUMENTS

| | | | |
|---|---|---|---|
| 4,488,351 | 12/1984 | Momose | 437/34 |
| 4,530,150 | 7/1985 | Shirato | 437/44 |
| 4,577,391 | 3/1986 | Hsia et al. | 437/56 |
| 4,590,663 | 5/1986 | Haken | 437/44 |
| 4,621,412 | 11/1986 | Kobayashi et al. | 437/162 |
| 4,642,878 | 2/1987 | Maeda | 437/34 |
| 4,714,519 | 12/1987 | Pfiester | 437/44 |
| 4,722,909 | 2/1988 | Parrillo et al. | 437/44 |
| 4,735,916 | 4/1988 | Homma et al. | 437/162 |
| 4,745,086 | 5/1988 | Parrillo et al. | 437/44 |
| 4,753,898 | 6/1988 | Parrillo et al. | 437/34 |
| 4,757,026 | 7/1988 | Woo et al. | 437/34 |
| 4,760,033 | 7/1988 | Mueller | 437/34 |
| 4,764,477 | 8/1988 | Chang et al. | 437/44 |
| 4,764,480 | 8/1988 | Vora | 437/162 |
| 4,784,971 | 11/1988 | Chiu et al. | 437/57 |
| 4,818,714 | 4/1989 | Haskell | 437/44 |
| 4,822,754 | 4/1989 | Lynch et al. | 437/162 |
| 4,826,782 | 5/1989 | Sachitano | 437/162 |
| 4,843,023 | 6/1989 | Chiu et al. | 437/44 |
| 4,939,154 | 7/1990 | Shimbo | 437/41 |
| 4,945,070 | 7/1990 | Hsu | 437/34 |

FOREIGN PATENT DOCUMENTS

| | | | |
|---|---|---|---|
| 0241267 | 11/1985 | Japan . | |
| 0177471 | 7/1988 | Japan | 357/23.3 |
| 0187644 | 8/1988 | Japan | 357/23.3 |

OTHER PUBLICATIONS

Pfiester, "LDD MOSFET's Using Disposable Sidewall Spacer Technology", IEEE Electron Device Letters, vol. 9, No. 4, Apr. 1988, pp. 189-192.

Primary Examiner—Olik Chaudhuri
Assistant Examiner—M. Wilczewski
Attorney, Agent, or Firm—Maurice Jay Jones

[57] ABSTRACT

An improved LDD CMOS fabrication is disclosed which uses a reduced number of processing steps. In accordance with one embodiment of the invention, a silicon substrate is provided which has first and second surface regions of opposite conductivity type. First and second silicon gate electrodes overlie the first and second surface regions, respectively. A dopant source layer containing dopant impurities of the first conductivity type is deposited over the first and second gate electrodes. This dopant source layer is patterned to form sidewall spacers at the edges of the first silicon gate electrode. Those sidewall spacers are used in the formation of the LDD structure on the devices formed in the first surface region. After removing the sidewall spacers, the structure is heated to diffuse dopant impurities from the dopant source layer into the second surface region to form source and drain regions of transistors formed in that region. The only lithography step needed in this portion of the process is one to protect the dopant source layer over the second region while sidewall spacers are being formed in the first region.

8 Claims, 3 Drawing Sheets

CMOS PROCESS USING DOPED GLASS LAYER

BACKGROUND OF THE INVENTION

This invention relates generally to a method for making a CMOS integrated device, and more specifically to a method for fabricating an LDD CMOS device using a minimum of mask steps.

The fabrication of semiconductor devices is becoming an evermore complex process. As the complexity of the devices increases, more and more processing steps are required to fabricate the desired device. Each processing step that is added to the process, however, increases the cost of manufacture and also reduces the yield of the manufactured device. In designing a manufacturing process, therefore, it is desirable to minimize the number of process steps, and especially to minimize the number of lithography masking steps.

The CMOS device structure has now become the most widely used semiconductor device structure. The process for manufacturing CMOS devices inherently has a large number of steps because of the necessity for separately manufacturing both N channel devices and P channel devices. In addition, many CMOS device implementations require an LDD (lightly doped drain) structure which can add further to the number of process steps required. With the objective of providing a manufacturable CMOS process having a minimum number of processing steps, a need existed for a simplified CMOS process.

It is therefore an object of this invention to provide an improved LDD CMOS process.

It is a further object of this invention to provided an improved LDD CMOS process with a reduced number of processing steps and especially a reduced number of lithography processing steps.

BRIEF SUMMARY OF THE INVENTION

The foregoing and other objects and advantages of the invention are achieved through a process in which a dopant source layer is used as both a sidewall spacer material and as the source of dopany impurities for the source and drain regions of one of the complementary device types. In accordance with one embodiment of the invention, the method for fabricating the CMOS integrated device structure includes the steps of providing a silicon substrate which has first and second surface regions of opposite conductivity types. Silicon gate electrodes are formed overlying each of the surface regions. A dopant source layer containing dopant impurities of a first conductivity type is deposited overlying the silicon gate electrodes. This dopant source layer is patterned to form sidewall spacers at the edges of the silicon gate electrodes overlying the surface region of first conductivity type. The sidewall spacers are used as ion implantation masks to position heavily doped source and drain regions spaced a prescribed distance from the corresponding gate electrodes. After removing the sidewall spacers, the remaining dopant source layer is heated to diffuse dopant impurities into the underlying silicon substrate to form source and drain regions in the second conductivity type surface region. The only masking step needed for this portion of the process is that used to protect the dopant source layer over the second surface region during the formation of the sidewall spacers at the edges of the gates overlying the first surface regions.

DETAILED DESCRIPTION OF PREFERRED EMBODIMENTS

FIGS. 1-7 illustrate, in cross-section, process steps in accordance with one embodiment of the invention by which a CMOS integrated circuit device is fabricated. In the figures and the accompanying descriptions, the fabrication of only two devices, one P channel and one N channel, is illustrated. Those skilled in the art will recognize, of course, that the fabrication of an actual intregated circuit device will involve the simultaneous fabrication of many such devices to implement the desired circuit function. The initial steps in the process by which the semiconductor substrate is prepared are not illustrated and neither are the final steps in the fabrication sequence as both can be done in conventional manner. Many alternate and conventional ways exist for implementing these initial and final steps, any number of which can be combined with the inventive process to produce a completed device. In accordance with this illustrative embodiment, a device is fabricated having an LDD structure on the N channel device and a conventional drain structure on the P channel device. Many CMOS devices are fabricated in this manner. The opposite type device structure can also be fabricated by this inventive process by interchanging N and P.

Figure 1:
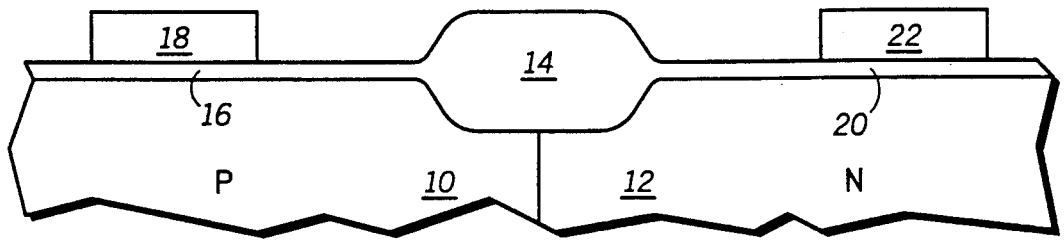
FIGS. 1-7 illustrate, in cross section, process steps in accordance with one embodiment of the invention.

FIG. 1 illustrates a silicon substrate structure after the initial processing steps have been completed. The substrate structure includes a P type surface region 10 and an N type surface region 12. These can be formed as an N well structure, a P well structure, or a twin well structure. The N and P type surface regions are separated at the surface by a thick field oxide 14 such as would be produced by a local oxidation process or by other isolation technique. A gate insulator 16 and gate electrode 18 are formed overlying P type region 10 and will form the gate insulator and gate electrode of an N channel MOS device. Similarly, gate insulator 20 and gate electrode 22 overlie N type surface region 12 and will form the gate insulator and gate electrode of a P channel MOS transistor. Gate insulator 16 and 20 are preferably silicon dioxide having a thickness and a range of 10-25 nanometers and gate electrodes 18 and 22 are preferably silicon having a thickness of 200-300 nanometers.

Figure 2:
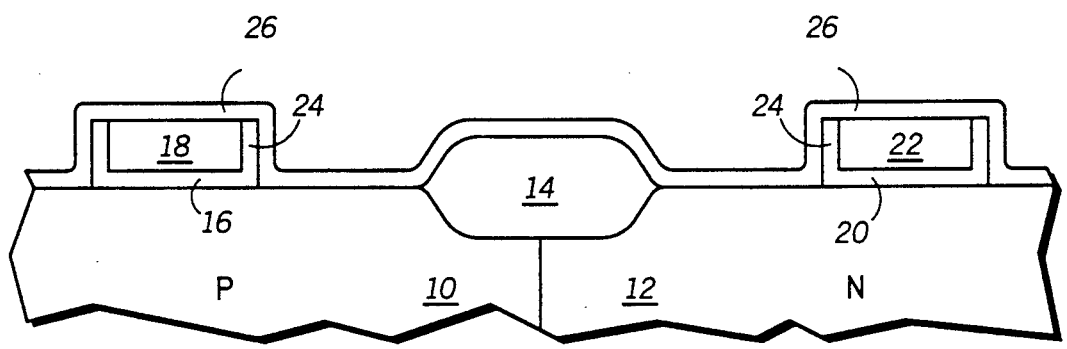

After patterning gate electrodes 18 and 22, a thin silicon dioxide layer is grown to repair any damage to the gate insulator caused by the patterning operation. The oxide layer, which, alternatively, can be deposited, has a thickness of about 20-50 nanometers. This thin oxide layer and the exposed portions of the gate insulators are anisotropically etched, for example by reactive ion etching, to leave a thin oxide sidewall 24 on the edge of each of the silicon gate electrodes. The edges of the gate insulators are thus protected by the thin oxide layer, but those portions of the semiconductor substrate which will eventually form the source and drain regions of the complementary devices are exposed. A thin undoped polycrystalline silicon layer 26 is then deposited over the structure including the gate electrodes, sidewall oxide, and exposed portions of the surface regions 10 and 12 as illustrated in FIG. 2.

Figure 3:
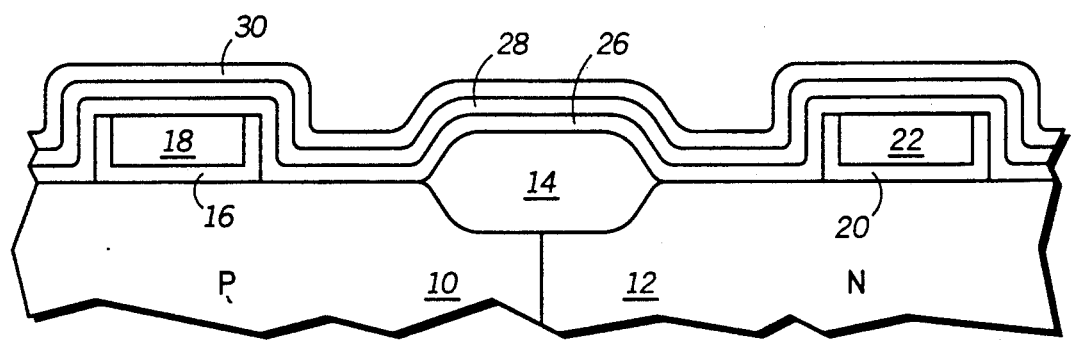

As illustrated in FIG. 3, the process continues by the deposition of a dopant source layer overlying thin polycrystalline silicon layer 26. In accordance with this illustrative embodiment, the dopant source layer contains boron impurities. In accordance with a preferred embodiment, the dopant source layer includes a spin on boron doped glass layer 28 which is capped by an undoped low-temperature oxide (LTO) 30 which ban be deposited by low pressure chemical deposition (LPCVD). Alternatively, the dopant source layer can be a LPCVD borosilicate glass layer which is then covered by a LTO or can be a LTO layer which is subsequently implanted with boron to provide the dopant material. The boron doped glass and the capping layer, regardless of how formed, will be used, in a subsequent step, to form a sidewall spacer in the formation of N channel devices, and, in accordance with the invention, as a dopant source for the formation of source and drain regions of the complementary P channel devices. The combined thickness of the boron doped glass and the undoped glass will determine the width of the sidewall spacer. The total thickness, which can be in the range of, for example, 200-600 nanometers, is adjusted to achieve the desired spacer width.

Figure 4:
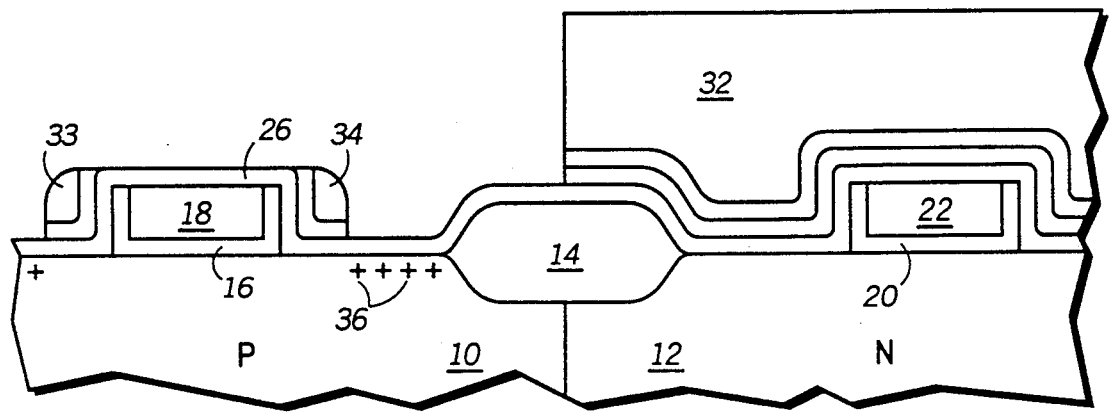
Figure 5:
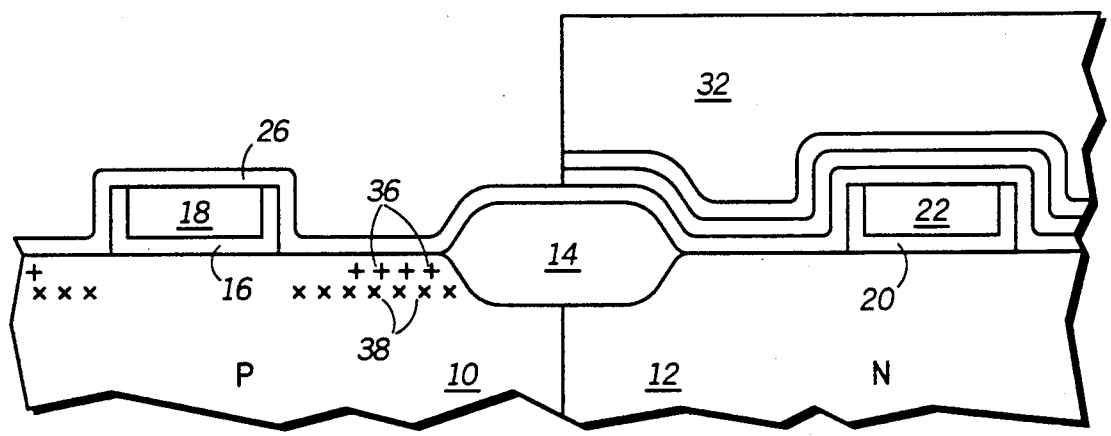

A photoresist layer is applied over the dopant source layer and capping oxide. The resist layer is patterned using conventional photolithography to form a resist mask 32 as illustrated in FIG. 4. This is the only masking operation which is needed in this portion of the CMOS fabrication process. The resist is patterned to form a mask 32 which overlies the N type surface region 12. Mask 32 thus protects that portion of the substrate in which the P channel device will be fabricated. With mask 32 in place, boron doped glass layer 28 and undoped LTO layer 30 are anisotropically etched, preferably by reactive ion etching, to form sidewall spacers 33 and 34 at the edges of gate electrode 18. During this anisotropic etching step, thin polycrystalline silicon layer 26 acts as an etch stop and as an indicator that the etching is completed. As further illustrated in FIG. 4, N type ions are implanted into surface region 10 using sidewall spacers 33 and 34 as well as mask 32 as ion implantation masks. Using sidewall spacers 33 and 34 as an implant mask spaces the implant, indicated by the plus signs 36, a desired distance away from the edge of gate electrode 18.

Again using thin polycrystalline silicon layer 26 as an etch stop barrier, sidewall spacers 33 and 34 are removed from the N channel portion of the structure. With the sidewall spacers removed, the structure is again ion implanted with additional N type ions. The second implantation is masked by and aligned with gate electrode 18 and is also masked by photoresist mask 32. As illustrated by the x's 38 in FIG. 5, the ions of the second implantation are aligned with gate electrode 18 whereas the ions of the first implantation are spaced away from that electrode. As is well known, the first implantation of N type dopant impurities forms the heavily doped contact region of the source and drain regions of the N channel device and the seond implantation of N type impurities forms the lightly doped portion of the source and drain regions.

Figure 6:
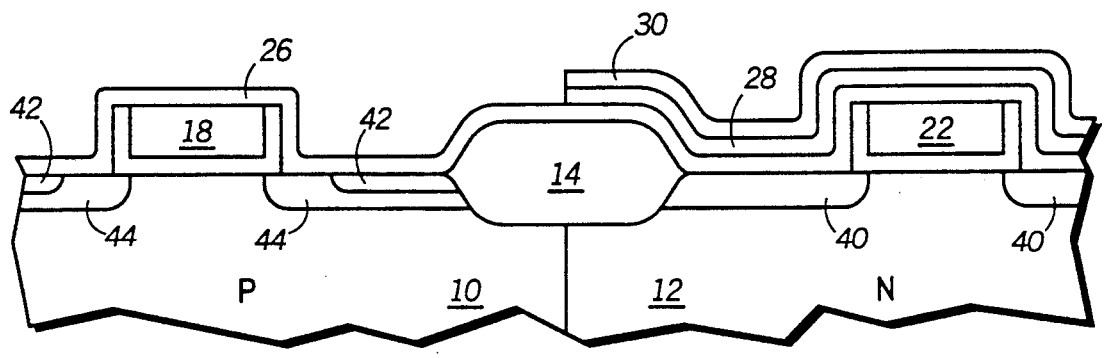

After the second N type ion implantation, photoresist mask 32 is removed and the structure is heated, preferably in a nitrogen ambient, to form the source and drain regions as illustrated in FIG. 6. The heating step serves to redistribute boron from dopant source layer 28 to form source and drain regions 40 of the P channel MOS transistor formed in N type surface region 12. During the heating step the undoped capping layer 30 prevents the out diffusion of boron from layer 28 into the N channel devices formed in P type surface region 10. The heating step also serves to activate the ions implanted during the two previous N type ion implantations, thus forming a heavily doped source and drain region 42 and a lightly doped source and drain region 44.

Figure 7:
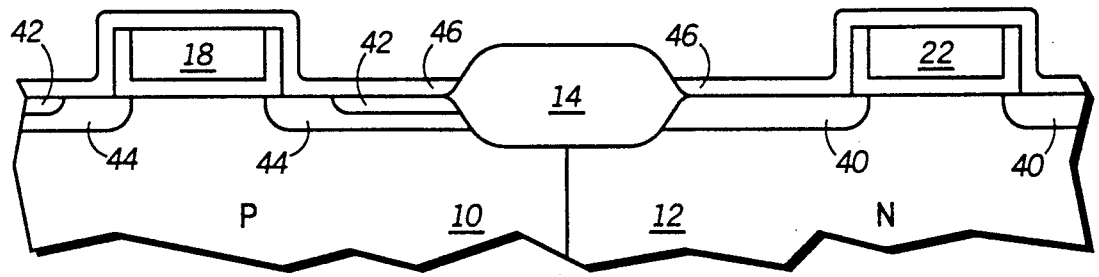

As illustrated in FIG. 7, the process in accordance with the invention is completed by etching to remove the remaining portions of dopant source layer 28 and undoped capping layer 30. During this etch step, polycrystalline silicon layer 26 again acts as an etch barrier to prevent damage to the underlying silicon substrate or to the underlying gate electrodes 18 and 22. Having no further use in the process, polycrystalline silicon layer 26 is oxidized by heating the structure in an oxidizing ambient to form a thin silicon dioxide layer 46 overlying silicon gate electrodes 18 and 22 and also the exposed portions of surface regions 10 and 22. Processing of the CMOS device structure then proceeds in conventional manner which includes, for example, the formation of contacts to the various device regions, the necessary interconnection between devices, and the like.

Thus it is apparent that there has been provided, in accordance with the invention, an improved process for fabricating LDD CMOS devices which fully meets the objects and advantages set forth above. Although the invention has been described and illustrated with reference to specific embodiments thereof, it is not intended to limit the invention to these illustrative embodiments. Those skilled in the art will recognize that variations and modifications are possible without departing from the spirit of the invention. For example, other insulating layers than those enumerated can be used, and additional steps can be inserted, such as for adjusting the threshold voltage of various devices, and the like. Other means can be used for isolating between devices, such as trench isolation. Accordingly, it is intended to encompass within the invention all such variations and modifications as fall within the scope of the appended claims.

I claim:

1. A method for fabricating a CMOS integrated device comprising the steps of:
   providing a silicon substrate having a first surface region of first conductivity type and a second surface region of second conductivity type;
   forming a first silicon gate electrode overlying said first surface region and a second silicon gate electrode overlying said second surface region;
   depositing a dopant source layer containing dopant impurities of said first conductivity type overlying said first and second silicon gate electrodes;
   patterning said dopant source layer overlying said first silicon gate electrode to form sidewall spacers at edges of said first silicon gate electrode;
   doping portions of said first surface region with conductivity determining dopant impurities of said second conductivity type using said sidewall spacers as dopant masks; and
   heating said dopant source layer to diffuse dopant impurities therefrom to dope portions of said second surface region with conductivity determining dopant of said first conductivity type.

2. The method of claim 1 further comprising the steps of forming a layer of oxide overlying edges of said first and second gate electrodes and depositing a layer of polycrystalline silicon overlying said layer of oxide before said step of depositing a dopant source layer.

3. A method for fabricating a CMOS integrated device comprising the steps of:
   providing a silicon substrate having a first surface region of first conductivity type and a second surface region of second conductivity type;
   forming a first silicon gate electrode overlying said first surface region and a second silicon gate electrode overlying said second surface region;
   depositing a dopant source layer containing dopant impurities of said first conductivity type overlying said first and second silicon gate electrodes;
   forming a mask overlying said second surface region to protect the dopant source layer thereunder;
   anisotropically etching said dopant source layer overlying said first silicon gate electrode to form sidewall spacers at edges of said first silicon gate electrode;
   doping portions of said first surface region with conductivity determining dopant impurities of said second conductivity type using said sidewall spacers as dopant masks; and
   heating said dopant source layer to diffuse dopant impurities therefrom to dope portions of said second surface region with conductivity determining dopant of said first conductivity type.

4. The method of claim 3 wherein said step of doping portions of said first surface region comprises: implanting ions of said second conductivity type into said first surface region using said sidewall spacers and said mask as ion implant masks; removing said sidewall spacers; and implanting said first surface region with additional ions of said second conductivity type using said mask as an ion implantation mask.

5. The method of claim 3 wherein said step of depositing a dopant source layer comprises the steps of forming an impurity doped glass layer; and depositing an undoped glass layer overlying said impurity doped glass layer.

6. The method of claim 5 wherein said step of patterning said dopant source layer further comprises the step of patterning said undoped glass layer.

7. The method of claim 6 further comprising the step of removing said dopant source layer and said undoped glass layer overlying said first surface region before said step of heating.

8. A method for fabricating a CMOS integrated circuit device comprising the steps of;
   providing a silicon substrate having a first surface region of first conductivity type and a second surface region of second conductivity type;
   forming a first silicon gate electrode overlying said first surface region and a second silicon gate electrode overlying said second surface region;
   forming a layer of silicon oxide overlying edges of said first and second silicon gate electrodes;
   depositing a layer of undoped silicon overlying said layer of silicon oxide;
   depositing a dopant source layer containing dopant impurities of said first conductivity type overlying said layer of undoped silicon;
   depositing an undoped insulator layer overlying said dopant source layer;
   forming a photoresist mask overlying said surface region of second conductivity type;
   anisotropically etching said dopant source layer and said undoped insulator layer overlying said surface region of first conductivity type to form sidewall spacers at the edges of said first silicon gate electrode;
   implanting ions of second conductivity type into said first surface region using said sidewall spacers and said photoresist mask as implantation masks;
   removing said sidewall spacers;
   implanting additional ions of second conductivity type into said first surface region using said first silicon gate electrode and said photoresist mask as implantation masks;
   removing said photoresist mask;
   heating said dopant source layer to diffuse dopant impurities therefrom into said second surface region;
   removing remaining portions of said dopant source layer and said layer of silicon oxide using said layer of undoped silicon as an etch stop; and
   heating in an oxidizing ambient to convert said layer of undoped silicon to silicon dioxide.

* * * * *